United States Patent
Singh et al.

(10) Patent No.: US 12,133,368 B2
(45) Date of Patent: Oct. 29, 2024

(54) COOLING MASS AND SPRING ELEMENT FOR LOW INSERTION FORCE HOT SWAPPABLE ELECTRONIC COMPONENT INTERFACE

(71) Applicant: Intel Corporation, Santa Clara, CA (US)

(72) Inventors: Hardeep Singh, Foslom, CA (US); Rachit Sharma, Vancouver (CA); Timothy Glen Hanna, Tigard, OR (US); Devdatta P. Kulkarni, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 230 days.

(21) Appl. No.: 17/697,877

(22) Filed: Mar. 17, 2022

(65) Prior Publication Data

US 2022/0210952 A1 Jun. 30, 2022

Related U.S. Application Data

(60) Provisional application No. 63/278,059, filed on Nov. 10, 2021.

(51) Int. Cl.
*H05K 7/20* (2006.01)
*H05K 7/14* (2006.01)

(52) U.S. Cl.
CPC ....... *H05K 7/20772* (2013.01); *H05K 7/1489* (2013.01); *H05K 7/20254* (2013.01); *H05K 7/20263* (2013.01); *H05K 7/2049* (2013.01)

(58) Field of Classification Search
CPC .......... H05K 7/20772; H05K 7/20254; H05K 7/20263; H05K 7/2049; H05K 7/1489
USPC ..................................................... 361/679.53
See application file for complete search history.

(56) References Cited

U.S. PATENT DOCUMENTS

| | | | |
|---|---|---|---|
| 6,349,035 B1* | 2/2002 | Koenen ................. | H01L 23/473 29/890.03 |
| 2009/0277616 A1* | 11/2009 | Cipolla ................. | H01L 23/473 165/104.33 |
| 2011/0103005 A1* | 5/2011 | Neumann ............... | G06F 1/181 361/679.46 |
| 2019/0045651 A1* | 2/2019 | Ehlen .................... | E05B 65/006 |
| 2021/0307192 A1* | 9/2021 | Lee ..................... | H05K 7/20463 |
| 2022/0071051 A1* | 3/2022 | Chang ................ | H05K 7/20145 |

\* cited by examiner

*Primary Examiner* — Zhengfu J Feng
(74) *Attorney, Agent, or Firm* — Hanley, Flight & Zimmerman, LLC

(57) ABSTRACT

An apparatus is described. The apparatus includes a cooling mass. The apparatus includes a cooling block having an opening to receive a portion of the cooling mass. The apparatus having a spring element to be rotated about an axis of rotation. An obstruction between a hot pluggable electronic component and an electro-mechanical connector is to be removed by the spring element's rotation. The cooling mass is to be pressed toward the hot pluggable electronic component in response to a force induced by the spring element's rotation.

19 Claims, 10 Drawing Sheets

COOLING MASS AND SPRING ELEMENT FOR LOW INSERTION FORCE HOT SWAPPABLE ELECTRONIC COMPONENT INTERFACE

RELATED CASES

This application claims the benefit of U.S. Provisional Application No. 63/278,059, entitled, "THERMAL COOLING SOLUTIONS FOR PCIE HOT SWAPPABLE DEVICES", filed Nov. 10, 2021, which is incorporated by reference in its entirety.

BACKGROUND

Thermal engineers face challenges, especially with respect to high performance data center computing, as both computers and networks continue to pack higher and higher levels of performance into smaller and smaller packages. Creative cooling solutions are therefore being designed to keep pace with the thermal requirements of such aggressively designed systems.

FIGURES

Figure 3A:
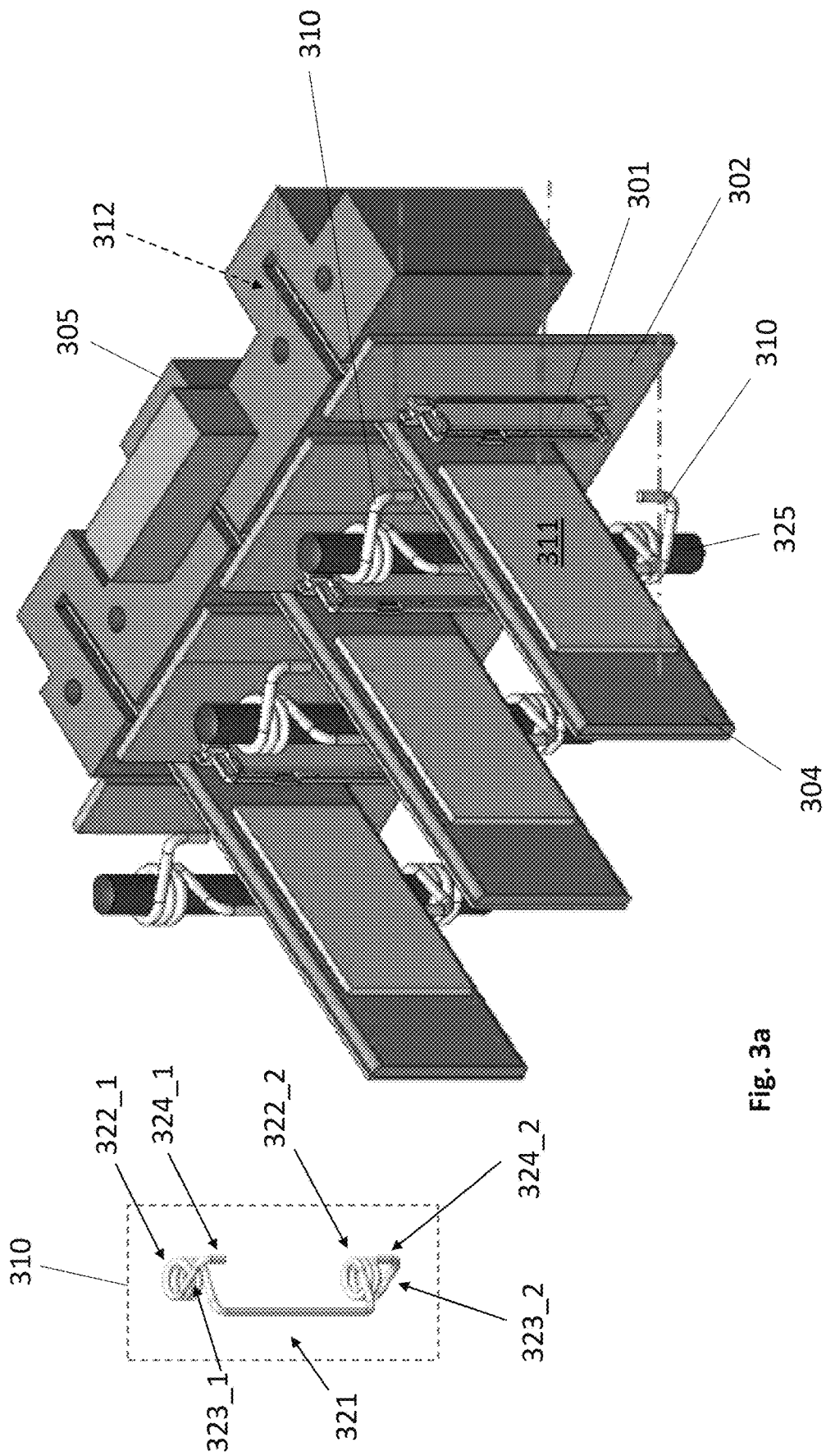
Figure 3B:
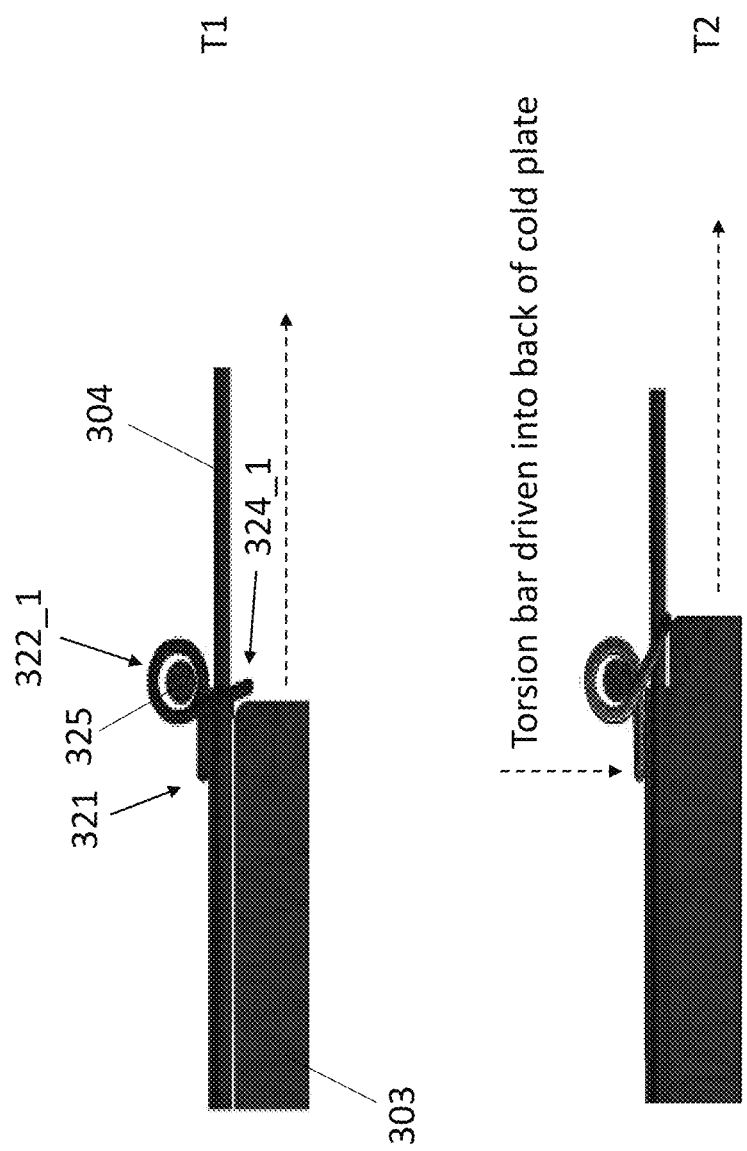
Figure 3C:
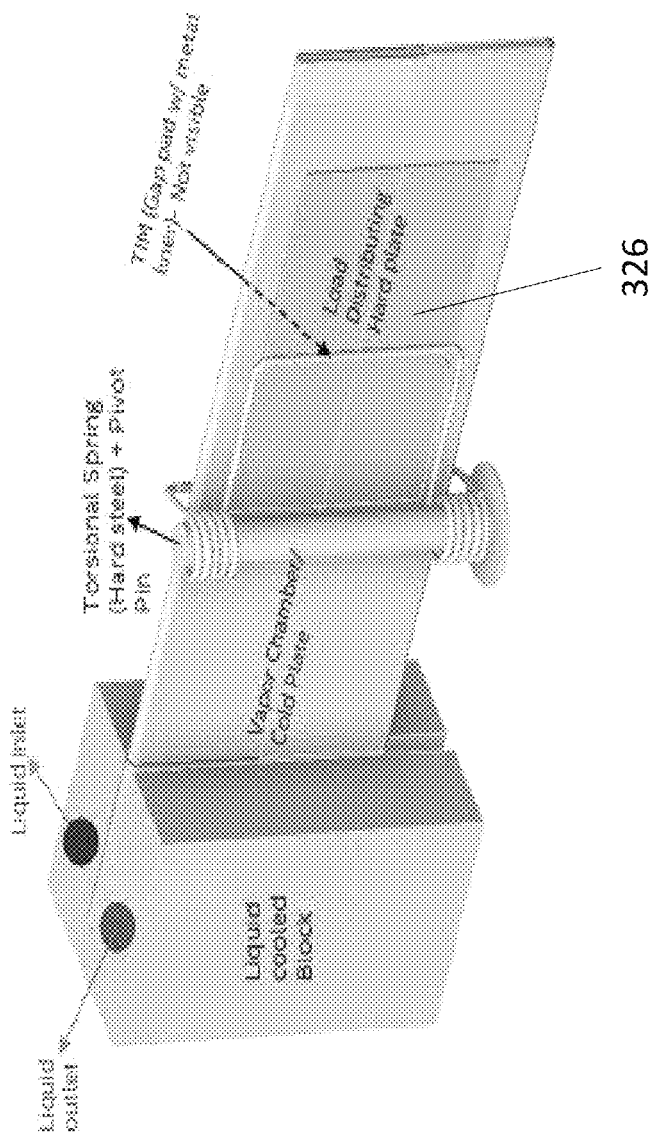
Figure 4A:
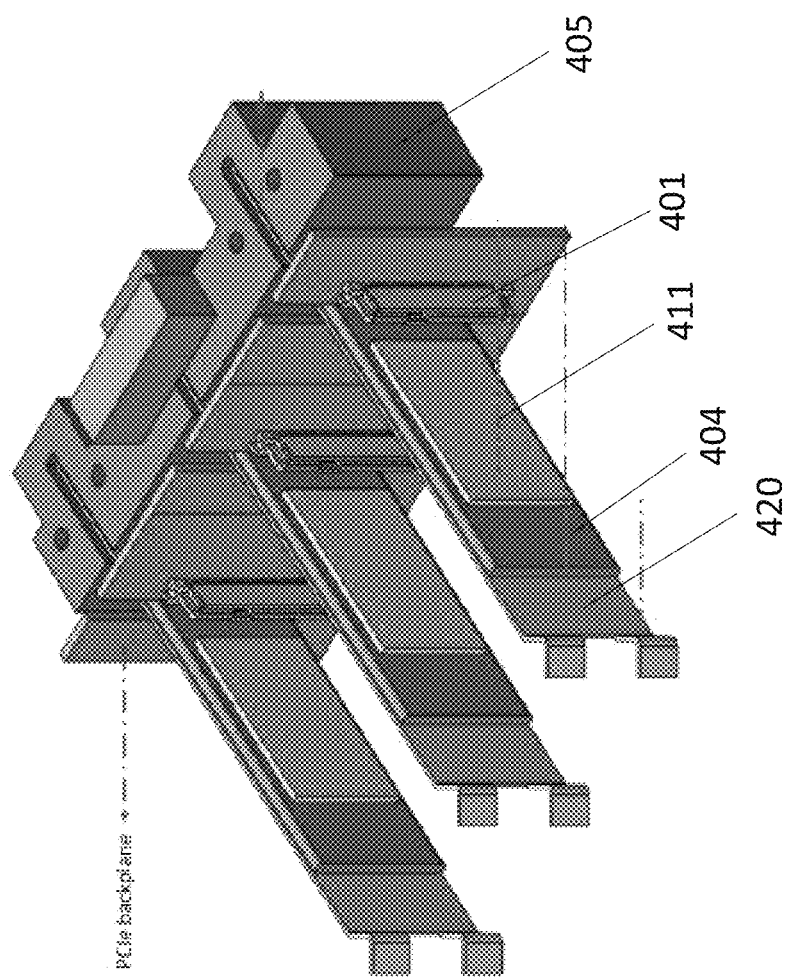
Figure 4B:
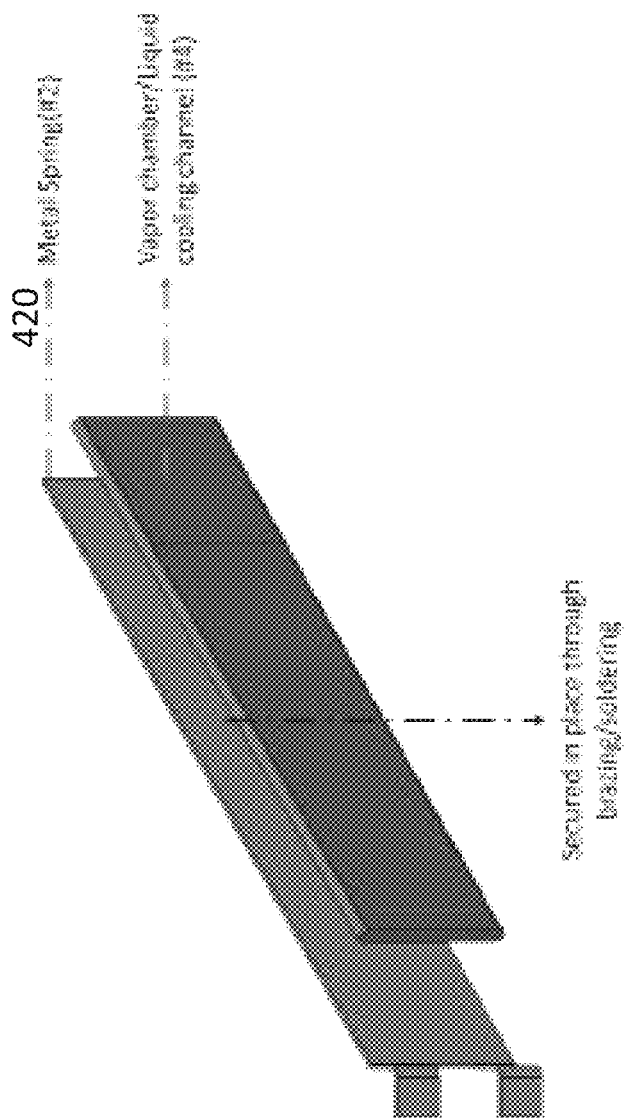
Figure 5:
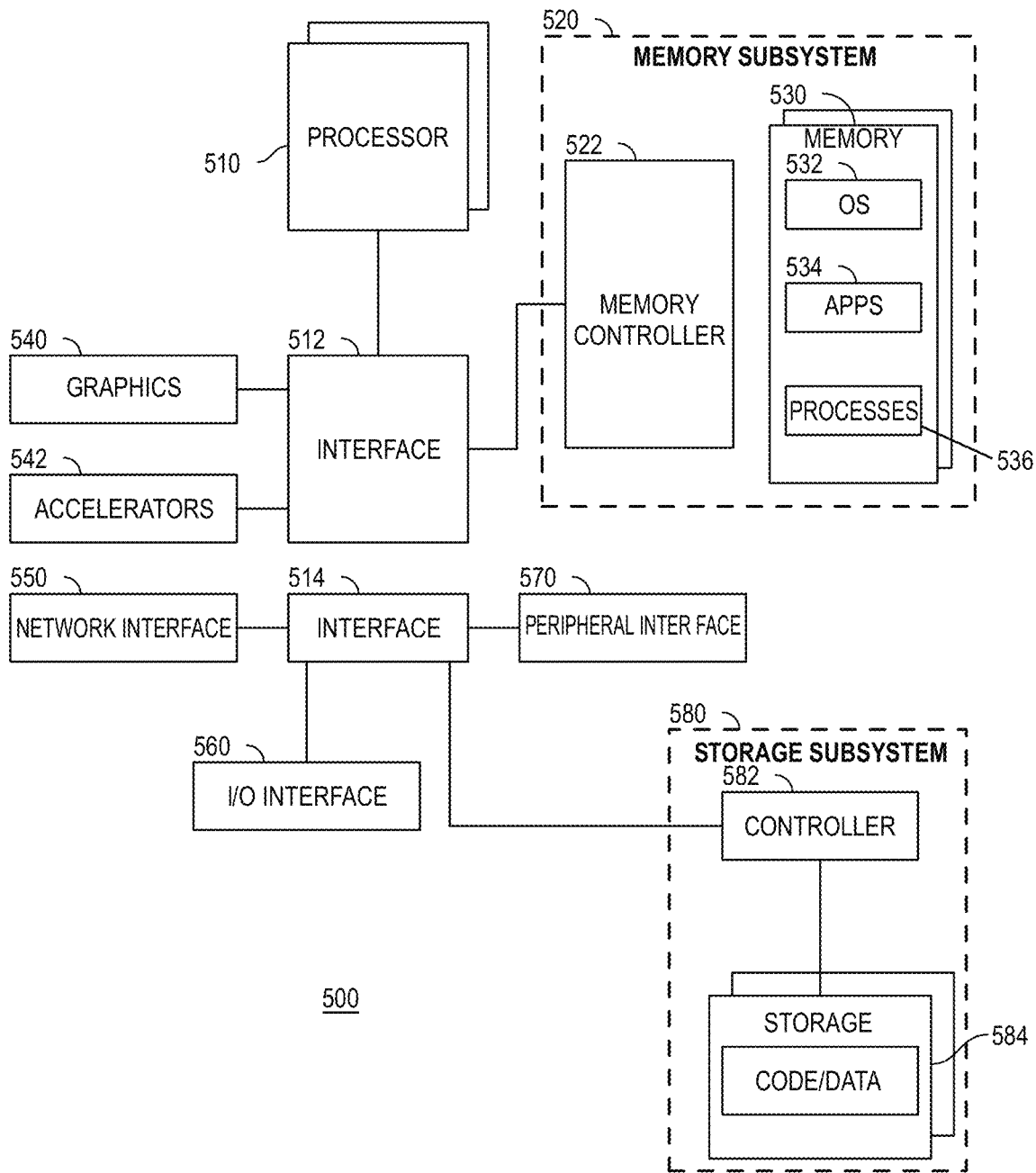
Figure 6:
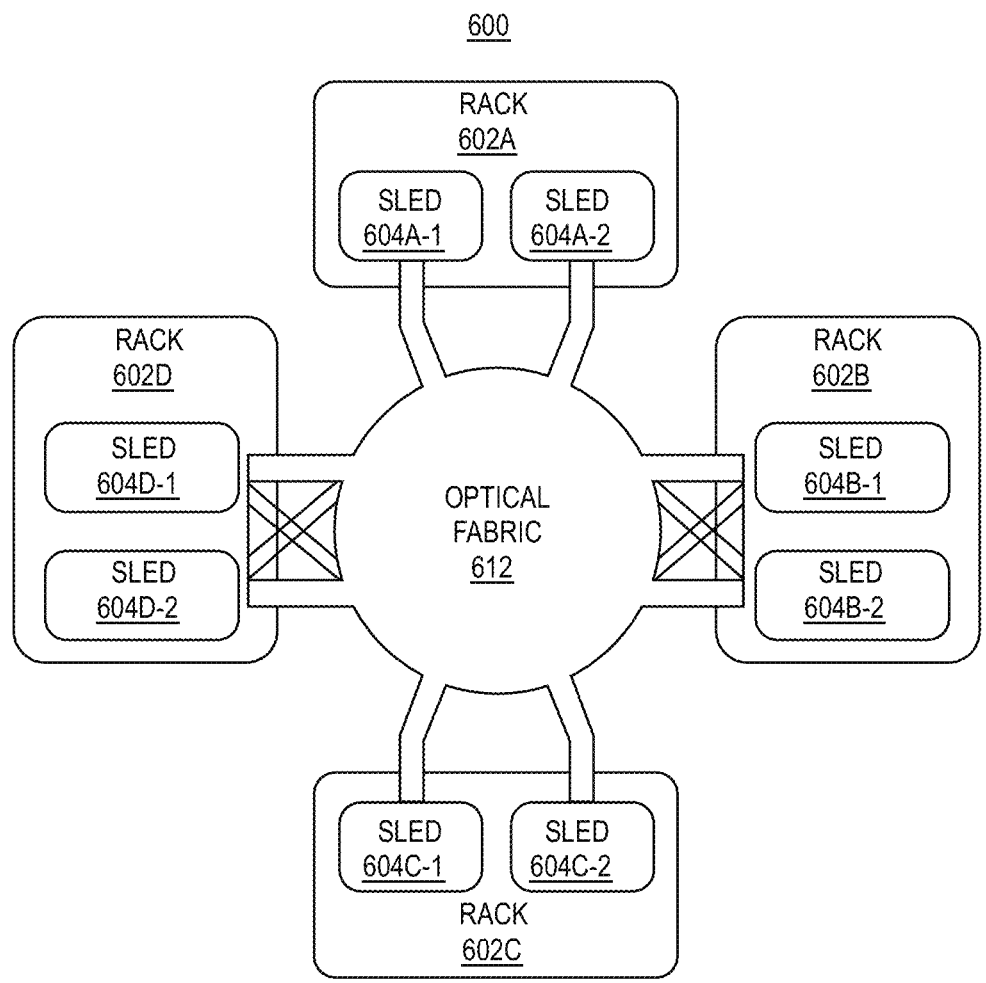
Figure 7:
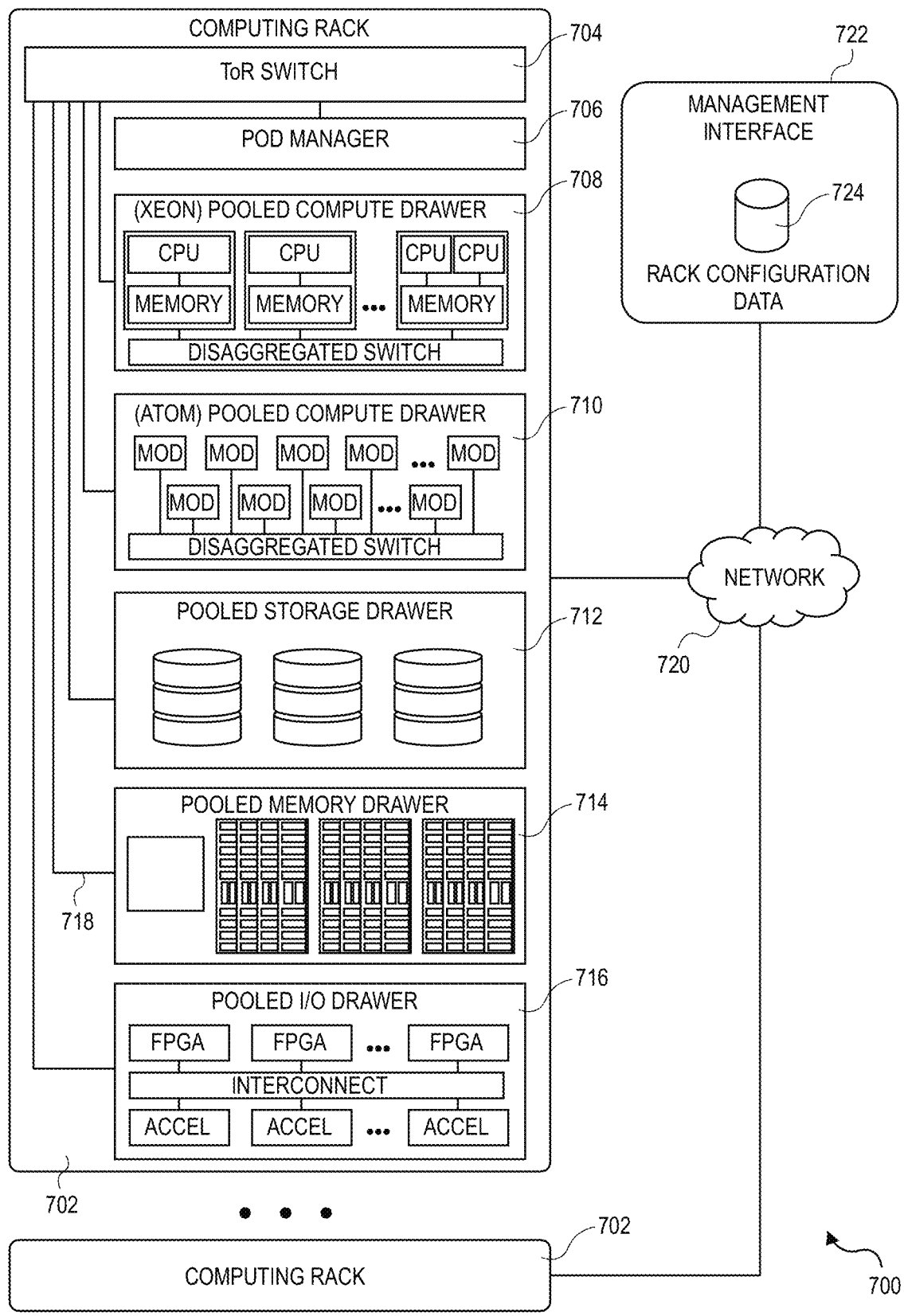

FIGS. 3a, 3b, and 3c depict a first embodiment of an improved hot pluggable electronic component interface;

FIGS. 4a and 4b depict a second embodiment of an improved hot pluggable electronic component interface;

FIG. 5 shows an electronic system;

FIG. 6 shows a data center;

FIG. 7 shows a rack.

DETAILED DESCRIPTION

Figure 1:
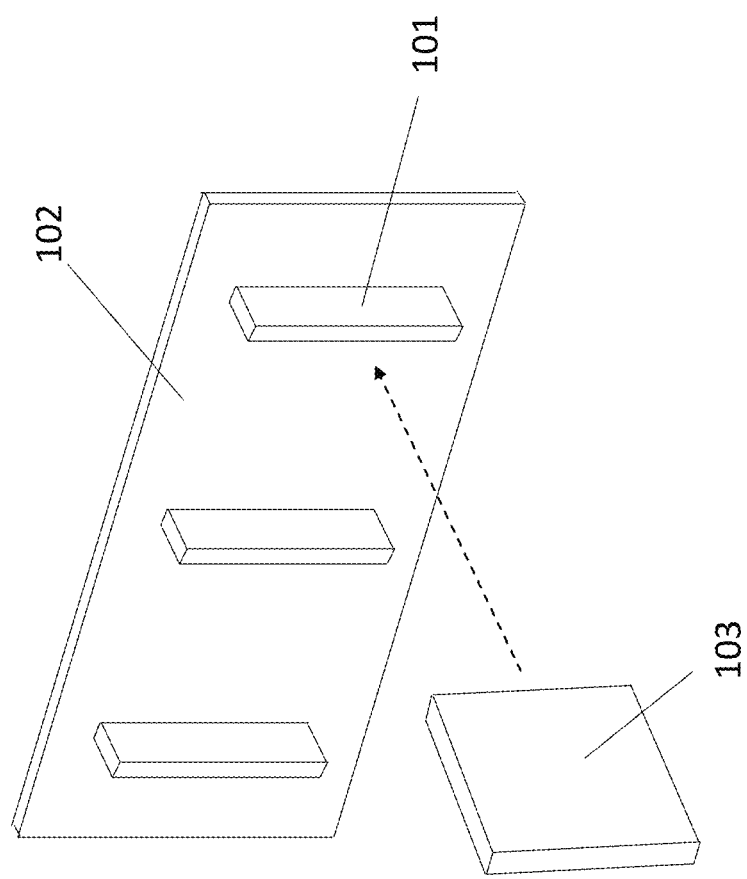
FIG. 1 shows a hot pluggable electronic component interface.

FIG. 1 shows a standard hot-swappable (also referred to as hot-pluggable) electro-mechanical interface (such as a peripheral components interconnect extended (PCIe) interface). As observed in FIG. 1, the interface includes multiple electro-mechanical connectors 101 mounted to a backplane 102 (for ease of drawing, only one connector 101 is labeled in FIG. 1). The backplane 102, such as a riser card, is typically mounted to a motherboard or other kind of system board (not shown in FIG. 1).

A hot-swappable interface supports the insertion/removal of an electrical component 103 (e.g., solid state drive (SSD), network interface component (NIC), etc.) to/from a connector 101 while the connector 101 is providing one or more power supply voltages. As such, a component 103 immediately receives power when it is inserted into its particular connector 101. Likewise, when a component is removed, the connector 102 continues to provide power supply voltage(s) during the removal.

Hot swapping is an improvement over traditional electronic systems which required a connector's power supply voltages to turned off during either or both of a component's insertion and/or removal from its connector. With supply voltage(s) not being present, e.g., in the case of insertion, the bring-up of the component consumed extensive amounts of time or otherwise introduced complications to the system.

For example, if a component was newly inserted into a connector, system software had to cease the traffic of the interface's other connectors so that a boot-up sequence could for executed for the interface. By contrast, with hot-swapping, a component 103 is simply plugged into a fully powered connector 102 and any boot-up activity is confined to the newly installed component (the traffic of the interface's other connectors continues to flow during the component's installation and bring-up).

With the continued increase in centralized computing (e.g., cloud computing) and the steady increase in computing performance generally, hot-swappable components are becoming increasingly power hungry. This trend not only brings power distribution challenges to the interface but also brings cooling challenges as well.

Specifically, the increasing power consumption results in a liquid cooling system being integrated into the interface's mechanical design. As such, when a component is installed into the interface, the component is not only connected to the electro-mechanical connector but is also thermally coupled to the liquid cooling system so that the liquid cooling system can remove potentially large amounts of heat generated by the component.

Importantly, consistent with the characteristics of a hot-swappable interface, the design of the liquid cooling system should embrace the quick and easy insertion/removal of a component to/from a connector over, potentially, many hundreds of insertion/removal cycles (or more).

A particular challenge is that, ideally, a low thermal resistance exists between the component and the liquid cooling system. Unfortunately, low thermal resistances are typically achieved with large forces that tightly press a liquid cooling system component (e.g., a liquid cooled heat spreader) against the surface of the component. Without careful design, such large forces could translate into large insertion/removal forces needed to install/remove a component to/from the interface, which, in turn, diminishes the ease and simplicity by which components are supposed to be added/removed to/from a hot-swappable interface.

Figure 2:
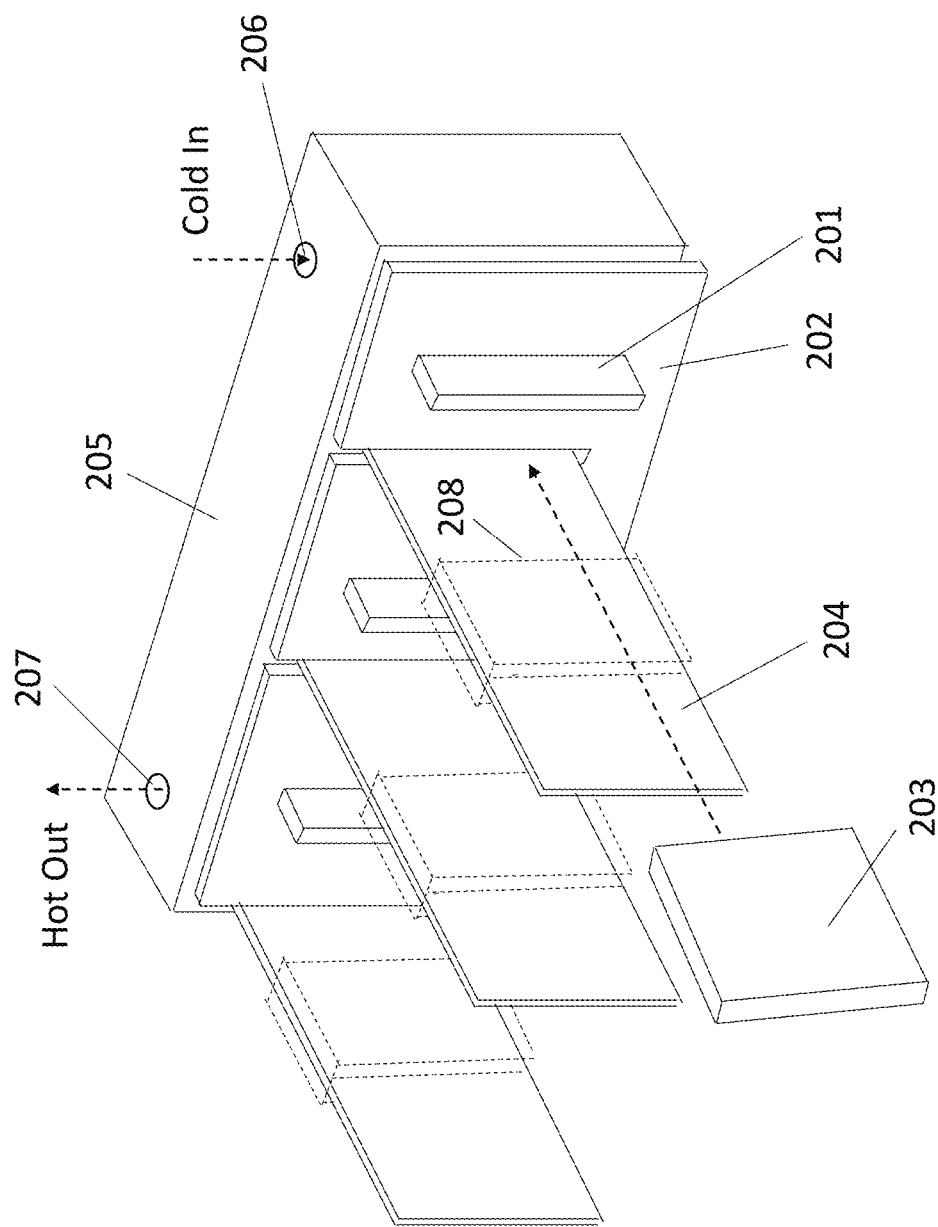
FIG. 2 shows an improved hot pluggable electronic component interface.

FIG. 2 shows an embodiment of an improved (e.g., PCIe) hot-swappable interface that includes a liquid cooling solution as described just above. Here, with the import of a hot-swappable interface being the ability to quickly add/remove a component to/from a system, the liquid cooled thermal interface quickly and easily engages/disengages with/from the component as the user slides the component in/out of the interface with minimal insertion force. Moreover, the system is largely composed of metals or metal alloys thereby allowing insertion/removal cycles in the hundreds at least for any particular slot.

As observed in FIG. 2, the liquid cooling component includes a heat spreader 204 that is thermally coupled to a cold plate 205. The cold plate 205 includes internal fluidic channels and one or more cool fluid input ports 206 and hot fluid output ports 207. The heat spreader 204, in various embodiments, also has a thermal interface material (TIM) on the area of the heat spreader 204 that is at least partially covered by a component that is installed into the interface.

The liquid cooling system also includes a spring loading mechanism 208 that keeps the outer surface of a plugged-in component pressed against the TIM and/or heat spreader 204. The pressing of the plugged-in component against the TIM and heat spreader ensures low thermal resistance between the plugged-in component and TIM/heat spreader so that heat generated by the plugged-in component easily transfers from the component to the heat spreader 204.

In various embodiments, the spring loaded mechanism 208 incudes some kind of spring element (e.g., spring, tab, finger, torsion bar, torsion spring, etc.) that is stretched, expanded, bent or compressed as the component 203 is being plugged into its connector 201. Here, when a component 203 is not plugged into a connector 201, the spring element is in a natural, relaxed state. However, when a component 203 is in the process of being plugged into its connector 201, the component 203 presses against some mechanical feature of the spring loaded mechanism 208 which, in turn, causes the spring element to depart from its relaxed state (e.g., by being stretched, compressed, etc.).

The departure of the spring element from its relaxed state creates a loading force (the spring desires to return to its relaxed state) that presses the heat spreader 204 and component 203 towards one another. As mentioned above, the pressing of the heat spreader 204 and component 203 towards one another creates a low thermal resistance between the heat spreader 204 and component 203.

As described in more detail below, in various embodiments, the spring loaded mechanism 208 includes a lever arm that the component 203 presses against as it is being plugged into its connector 201. The pressing of the component 203 against the lever arm, in turn, creates a large torque about a pivot point or rotational axis that causes the spring element to depart from its natural state thereby creating the high loading force needed for low thermal resistance between the component 203 and heat spreader 204. However, because of the mechanical advantage of the lever arm, only a modest insertion force needs to be applied by a technician to create the desired pivoting/rotation and corresponding spring element compression/expansion.

FIGS. 3a through 3c depict a first embodiment in which a torsion spring 310 is used to implement the loading mechanism's spring element. FIG. 3a depicts a hot swappable interface having three unpopulated slots. As observed in FIG. 3a, each slot includes: 1) a connector 301; 2) a heat spreader 304 with TIM 311 attached thereto; 3) a torsion spring 310; and, 4) a cold plate 305. For ease of drawing reference labels are assigned only to features of the interface's first slot.

Here, an end of the heat spreader 304 is inserted into a notch 312 that is formed into the cold plate 305. Notably, the surface area of the plate/block interface is sufficiently large to effect a low thermal resistance between the heat spreader 304 and cold plate 305. As observed in FIG. 3a, a low thermal resistance interface exists between the heat spreader 304 and the cold plate 305 on both faces of the heat spreader 304 and the corresponding inner faces of the notch 312 formed in the cold plate 305.

In various embodiments the cold plate is composed of a thermally conductive material such as a metal or metal alloy (e.g., copper, copper alloy, aluminum or aluminum alloy). According to one manufacturing approach, the faces of the heat spreader 304 that are inserted into the notch 312 are soldered and/or brazed to the inner faces of the notch 312 to secure the heat spreader 304 to the cold plate 305 (both soldering and brazing use a third material to seal/secure two other bulk materials together). The solder material (e.g., tin-lead, tin-lead-copper, tin-copper, tin-silver, tin-silver-copper, cadmium-silver, cadmium-tin-silver, cadmium-zinc-silver) and/or the brazing material (copper alloy, silver alloy or brass alloy) has sufficiently low thermal resistance to ensure efficient heat transfer from the heat spreader 304 through the soldered/brazed junction to the cold plate 305.

In various embodiments the TIM 311 is a gap pad composed of low thermal resistance material and having a thermally conductive adhesive to secure the TIM 311 to the heat spreader 304. The TIM gap pad 311 helps ensure a "tight fit" between the heat spreader/TIM and the electrical component when the component is installed into the connector 301.

Referring to FIGS. 3a and 3b, the spring loading mechanism is implemented as a torsion spring 310. The torsion spring includes a torsion bar 321 between coil spring elements 322_1, 322_2 and torsion tabs 324_1, 324_2 that emanate from respective arms 323_1, 323_2 on the far ends of the coil spring elements 322_1, 322_2. The torsion bar 321 and spring elements 322_1, 322_2 are located on the back side of the heat spreader 304, whereas, the arms 323_1, 323_2 emanate into space on the front side of the heat spreader 304 so that the torsion tabs 324_1, 324_2 are also located on the front side of the heat spreader 305.

A pivot pin 325 is mounted to the same system board (not shown) that the backplane 302 is mounted to in a location that causes the torsion spring elements to be located in their respective positions as described above (the pin 325 runs through the cylindrical axis of the coil spring elements 322_1, 322_2).

When the torsion spring 320 is in its normal state and placed in the correct location with the help of the pivot pin 325, the torsion tabs 324_1, 324_2 are positioned in the pathway of a component that is to be plugged into the connector 301.

FIG. 3b shows the spring loading dynamics of the torsion spring 320 at two different moments of time (T1, T2) during the installation of a component 303 (a top down view of the first slot in the vicinity of the torsion spring 320 of the interface of FIG. 3a is shown in detail). At time T1 a component 303 is observed sliding along the surface of the heat spreader 304 toward its connector. Notably, the torsion tabs 324_1, 324_2 (only torsion tab 324_1 is visible in the top down view) are in the path way of the component's movement. Eventually the component 303 slides into the torsion tabs 324_1, 324_2.

In response to the component pressing into the torsion tabs 324_1, 324_2, as observed in time T2, the outer ends of the coil spring elements 322_1, 322_2 have rotated about the pivot pin 325 in a counter-clockwise direction relative to their position at time T1 to move the torsion tabs 324_1, 324_2 out of the way of the component 303.

The inner regions of the coil spring elements 322_1, 322_2 (the regions closer to the torsion bar 321), by contrast, cannot follow the rotation because rotation of the torsion bar 321 is blocked by the heat spreader 304. When the tabs 324_1, 324_2 are fully rotated out of the way of the component 303, the spring elements 322_1, 322_2 are stretched out of their normal state such that they induce an opposing force to the rotation that drives the torsion bar 321 into the back of the heat spreader 304.

It is pertinent to note that the technician need not apply a large force to force the rotation of the outer regions of the coil springs 322_1, 322_2 because the arms 323_1, 323_1 between the tabs 324_1, 324_2 and the springs 322_1, 322_2 act as lever arms that translate the small insertion force applied by the technician into a large torque that easily rotates the outer regions of the springs 322_1, 322_2 about the pivot pin 325.

The driving of the torsion bar 321 into the back of the heat spreader 304 drives the heat spreader 304 into the component 303 thereby ensuring a low thermal resistance between the heat spreader 304 and component 303. In a further embodiment, as observed in FIG. 3c, the heat spreader also includes a load distribution plate 326 to spread the force applied by the torsion bar 321 across a wider area of the back surface of the heat spreader 304. In various embodiments, the surface of the load distribution plate approximately corresponds to the size and dimensions of the installed component so that the heat spreader uniformly presses into most/all of the surface of the component that is in thermal contact with the heat spreader.

FIGS. 4a and 4b shows another embodiment where the spring loading mechanism is implemented as a cantilever spring 420. In the particular embodiment of FIG. 4, the cantilever spring 420 is anchored in the same notch in the cold plate 405 as the heat spreader 404. As such, the face of the cantilever spring 420 that directly faces one of the notch walls is soldered or brazed to the wall. Depending on implementation, the other face of the cantilever spring 420 can be soldered/brazed to the heat spreader 404 (e.g., along the entire length of the heat spreader or just in the vicinity of the notch).

In its natural state without a component being plugged into the connector 401, the presence of the cantilever spring 420 slightly bends or otherwise places the heat spreader 404 in space that would be occupied by a component if a component were plugged into the connector 401. As such, during the installment of a component into the connector 401, the component 401 enters this space and pushes the heat spreader out of the way. When the heat spreader 404 is pushed out of the way, the heat spreader 404 and cantilever spring bend 420 (or rotate about their point of contact with the cold plate 405 at the notch).

The bending/rotation creates a resistive force that presses the heat spreader 404 back into the component. The pressing of the heat spreader 404 into the component ensures low thermal resistance between the heat spreader and component. Notably, the length of the cantilever spring 420 acts as a lever arm at the point of bending/rotation at the notch in the cold plate 405. That is, assuming the component makes contact with the heat spreader 404 toward the outer edge of the heat spreader (away from the cold plate 405), whereas, the heat spreader 404 and cantilever spring 420 rotate about an axis that is toward their inner edge (the location of the notch), the extended length of the cantilever spring 420 (and heat spreader 404) acts as a lever arm that translates minimal insertion force applied by a technician into a significant torque about the axis of rotation at the notch that causes the cantilever spring 420 and heat spreader 404 to rotate as described just above.

Also, as observed in FIG. 4, the cantilever spring is permanently bent at its outer edge to form push-button shapes 427 that, when, pressed upon by a technician, causes the cantilever spring 420 (and heat spreader 404 if brazed/soldered to the cantilever spring element) to bend/rotate away from the component allowing for easy removal of the component from the connector 401.

Although embodiments above have stressed the use of a heat spreader, in other embodiments the heat spreader is replaced with a vapor chamber for, e.g., two phase immersion cooling. In the case of two phase immersion cooling, heat from an electronic device boils liquid in a chamber. The resultant vapor is then condensed to remove the heat. The cooled liquid that results from the condensation can then be reheated back into a vapor and the process repeats.

Thus, in an embodiment where a heat spreader is replaced with a vapor chamber, the vapor chamber is sealed so that the vaporization and condensation happens within the chamber. The vapor chamber fits into the cold plate like the heat spreader as described above. Heat from the vapor warms the edge of the vapor chamber that is within the notch of the cold plate. The heat is then transferred from the vapor chamber to the cold plate via the chamber/plate junction in the notch.

As such, any of heat spreaders 204, 304 could be replaced with a vapor chamber that is sealed and contains fluid. The internal fluid boils in response to heat from the semiconductor packages being transferred to the vapor chamber. The vapor chamber is composed of thermally conductive material (e.g., metal). Vapor molecules within the chamber that collide with the chamber walls condense back into a liquid within the chamber and the process repeats (heat is transferred from the vapor to the chamber walls, and then from the chamber walls to the cold plate 205, 305).

In other such vapor chamber embodiments the vapor chamber is not sealed but rather has an input port to receive cooled from the cold plate 205, 305 and an output port to provide hot vapor to the cold plate 205, 305. The hot vapor is routed from the cold plate 205, 305 to a heat exchanger than condenses the vapor back to a cooled liquid which is then returned to the cold plate 205, 305 and vapor chamber.

In still other embodiments any of the heat spreaders 204, 304 are replaced with a cold plate structure that has an input port to receive cooled fluid from the primary cold plate 205, 305 and an output port to return warmed fluid back to the primary cold plate 205, 305.

In even further embodiments the teachings above could be extended to air cooled systems in which the heat spreader or vapor chamber is replaced with a heat sink. In this case, the cold plate is replaced by a simple mechanical block that anchors the heat sink (e.g., no fluid conduits are not present within the block).

Any of a heat spreader, vapor chamber, and heat sink can more generally be referred to as a cooling mass. Likewise, any of a cold plate, a cold plate that receives heat from operating semiconductor chips in the form of hot vapor and provides cooled fluid to the operating semiconductor chips, and/or a simple mechanical block for anchoring a heat sink can be referred to more generally as a cooling block.

In various embodiments the cold plate 205/305 is coupled to a heat exchanger that receives the cold plate's warmed fluid (or vapor). The heat exchanger removes the heat from the fluid (or vapor) thereby producing cooled fluid. The cooled fluid is then sent to the cold plate 205/305 and the process repeats. In large scale implementations, such as a data center, the heat exchanger receives the warmed fluid from multiple cold plates (e.g., of multiple electronic systems installed in one or more racks) and returns cooled fluid back to the multiple cold plates.

The following discussion concerning FIGS. 5, 6, and 7 are directed to systems, data centers and rack implementations, generally. FIG. 5 generally describes possible features of an electronic system that can include one or more hot pluggable electronic component interface having a cooling assembly that is designed according to the teachings above. FIG. 6 describes possible features of a data center that can include such electronic systems. FIG. 7 describes possible features of a rack having one or more such electronic systems installed into it.

FIG. 5 depicts an example system. System 500 includes processor 510, which provides processing, operation management, and execution of instructions for system 500. Processor 510 can include any type of microprocessor, central processing unit (CPU), graphics processing unit (GPU), processing core, or other processing hardware to provide processing for system 500, or a combination of processors. Processor 510 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices. The system can also include a data processing unit (DPU) (also referred to as an infrastructure processing unit (IPU)) that, e.g., in hardware, receives incoming requests received by the system, analyzes the requests, and dispatches the requests to the appropriate processing resource in the system (e.g., CPU, GPU, accelerator, etc.).

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors to perform such networking functions (e.g., in a pipelined fashion or otherwise).

In one example, system 500 includes interface 512 coupled to processor 510, which can represent a higher speed interface or a high throughput interface for system components that needs higher bandwidth connections, such as memory subsystem 520 or graphics interface components 540, or accelerators 542. Interface 512 represents an interface circuit, which can be a standalone component or integrated onto a processor die. Where present, graphics interface 540 interfaces to graphics components for providing a visual display to a user of system 500. In one example, graphics interface 540 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 540 generates a display based on data stored in memory 530 or based on operations executed by processor 510 or both. In one example, graphics interface 540 generates a display based on data stored in memory 530 or based on operations executed by processor 510 or both.

Accelerators 542 can be a fixed function offload engine that can be accessed or used by a processor 510. For example, an accelerator among accelerators 542 can provide compression (DC) capability, cryptography services such as public key encryption (PKE), cipher, hash/authentication capabilities, decryption, or other capabilities or services. In some embodiments, in addition or alternatively, an accelerator among accelerators 542 provides field select controller capabilities as described herein. In some cases, accelerators 542 can be integrated into a CPU socket (e.g., a connector to a motherboard or circuit board that includes a CPU and provides an electrical interface with the CPU). For example, accelerators 542 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic circuitry, and programmable processing elements such as field programmable gate arrays (FPGAs). Accelerators 542 can provide multiple neural networks, processor cores, or graphics processing units can be made available for use by artificial intelligence (AI) or machine learning (ML) models. For example, the AI model can use or include any one or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 520 represents the main memory of system 500 and provides storage for code to be executed by processor 510, or data values to be used in executing a routine. Memory subsystem 520 can include one or more memory devices 530 such as read-only memory (ROM), flash memory, volatile memory, or a combination of such devices. Memory 530 stores and hosts, among other things, operating system (OS) 532 to provide a software platform for execution of instructions in system 500. Additionally, applications 534 can execute on the software platform of OS 532 from memory 530. Applications 534 represent programs that have their own operational logic to perform execution of one or more functions. Processes 536 represent agents or routines that provide auxiliary functions to OS 532 or one or more applications 534 or a combination. OS 532, applications 534, and processes 536 provide software functionality to provide functions for system 500. In one example, memory subsystem 520 includes memory controller 522, which is a memory controller to generate and issue commands to memory 530. It will be understood that memory controller 522 could be a physical part of processor 510 or a physical part of interface 512. For example, memory controller 522 can be an integrated memory controller, integrated onto a circuit with processor 510. In some examples, a system on chip (SOC or SoC) combines into one SoC package one or more of: processors, graphics, memory, memory controller, and Input/Output (I/O) control logic circuitry.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

The memory resources can also be tiered (different access times are attributed to different regions of memory), disaggregated (memory is a separate (e.g., rack pluggable) unit that is accessible to separate (e.g., rack pluggable) CPU units), and/or remote (e.g., memory is accessible over a network).

While not specifically illustrated, it will be understood that system 500 can include one or more buses or bus systems between devices, such as a memory bus, a graphics bus, interface buses, or others. Buses or other signal lines can communicatively or electrically couple components together, or both communicatively, and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 500 includes interface 514, which can be coupled to interface 512. In one example, interface 514 represents an interface circuit, which can include stand-alone components and integrated circuitry. In one example, multiple user interface components or peripheral components, or both, couple to interface 514. Network interface 550 provides system 500 the ability to communicate with remote devices (e.g., servers or other computing devices) over one or more networks. Network interface 550 can include an Ethernet adapter, wireless interconnection components, cellular network interconnection components, USB (universal serial bus), or other wired or wireless standards-based or proprietary interfaces. Network interface 550 can transmit data to a remote device, which can include sending data stored in memory. Network interface 550 can receive data from a remote device, which can include storing received data into memory. Various embodiments can be used in connection with network interface 550, processor 510, and memory subsystem 520.

In one example, system 500 includes one or more input/output (I/O) interface(s) 560. I/O interface 560 can include one or more interface components through which a user interacts with system 500 (e.g., audio, alphanumeric, tactile/touch, or other interfacing). Peripheral interface 570 can include any hardware interface not specifically mentioned above. Peripherals refer generally to devices that connect dependently to system 500. A dependent connection is one where system 500 provides the software platform or hardware platform or both on which operation executes, and with which a user interacts.

In one example, system 500 includes storage subsystem 580 to store data in a nonvolatile manner. In one example, in certain system implementations, at least certain components of storage 580 can overlap with components of memory subsystem 520. Storage subsystem 580 includes storage device(s) 584, which can be or include any conventional medium for storing large amounts of data in a nonvolatile manner, such as one or more magnetic, solid state, or optical based disks, or a combination. Storage 584 holds code or instructions and data in a persistent state (e.g., the value is retained despite interruption of power to system 500). Storage 584 can be generically considered to be a "memory," although memory 530 is typically the executing or operating memory to provide instructions to processor 510. Whereas storage 584 is nonvolatile, memory 530 can include volatile memory (e.g., the value or state of the data is indeterminate if power is interrupted to system 500). In one example, storage subsystem 580 includes controller 582 to interface with storage 584. In one example controller 582 is a physical part of interface 514 or processor 510 or can include circuits in both processor 510 and interface 514.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base, and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

Such non-volatile memory devices can be placed on a DIMM and cooled according to the teachings above.

A power source (not depicted) provides power to the components of system 500. More specifically, power source typically interfaces to one or multiple power supplies in system 500 to provide power to the components of system 500. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 500 can be implemented as a disaggregated computing system. For example, the system 500 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Although a computer is largely described by the above discussion of FIG. 5, other types of systems to which the above described invention can be applied and are also partially or wholly described by FIG. 5 are communication systems such as routers, switches, and base stations.

FIG. 6 depicts an example of a data center. Various embodiments can be used in or with the data center of FIG. 6. As shown in FIG. 6, data center 600 may include an optical fabric 612. Optical fabric 612 may generally include a combination of optical signaling media (such as optical cabling) and optical switching infrastructure via which any particular sled in data center 600 can send signals to (and receive signals from) the other sleds in data center 600. However, optical, wireless, and/or electrical signals can be transmitted using fabric 612. The signaling connectivity that optical fabric 612 provides to any given sled may include connectivity both to other sleds in a same rack and sleds in other racks.

Data center 600 includes four racks 602A to 602D and racks 602A to 602D house respective pairs of sleds 604A-1 and 604A-2, 604B-1 and 604B-2, 604C-1 and 604C-2, and 604D-1 and 604D-2. Thus, in this example, data center 600 includes a total of eight sleds. Optical fabric 612 can provide sled signaling connectivity with one or more of the seven other sleds. For example, via optical fabric 612, sled 604A-1 in rack 602A may possess signaling connectivity with sled 604A-2 in rack 602A, as well as the six other sleds 604B-1, 604B-2, 604C-1, 604C-2, 604D-1, and 604D-2 that are distributed among the other racks 602B, 602C, and 602D of data center 600. The embodiments are not limited to this example. For example, fabric 612 can provide optical and/or electrical signaling.

FIG. 7 depicts an environment 700 that includes multiple computing racks 702, each including a Top of Rack (ToR) switch 704, a pod manager 706, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 708, and INTEL® ATOM™ pooled compute drawer 710, a pooled storage drawer 712, a pooled memory drawer 714, and a pooled I/O drawer 716. Each of the pooled system drawers is connected to ToR switch 704 via a high-speed link 718, such as a 40 Gigabit/second (Gb/s) or 100 Gb/s Ethernet link or an 100+Gb/s Silicon Photonics (SiPh) optical link. In one embodiment high-speed link 718 comprises an 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 700 may be interconnected via their ToR switches 704 (e.g., to a pod-level switch or data center switch), as illustrated by connections to a network 720. In some embodiments, groups of computing racks 702 are managed as separate pods via pod manager(s) 706. In one embodiment, a single pod manager is used to manage all of the racks in the pod. Alternatively, distributed pod managers may be used for pod management operations. RSD environment 700 further includes a management interface 722 that is used to manage various aspects of the RSD environment. This includes managing rack configuration, with corresponding parameters stored as rack configuration data 724.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds, and other design or performance constraints, as desired for a given implementation.

Some examples may be implemented using or as an article of manufacture or at least one computer-readable medium. A computer-readable medium may include a non-transitory storage medium to store program code. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the program code implements various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled, and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
a cooling mass;
a cooling block including an opening to receive a portion of the cooling mass; and
a spring element to be rotated about an axis of rotation, an obstruction between a hot pluggable electronic component and an electro-mechanical connector to be removed by the spring element's rotation, the cooling mass to be pressed toward the hot pluggable electronic component in response to a force induced by the spring element's rotation.

2. The apparatus of claim 1 wherein the cooling mass is a heat spreader.

3. The apparatus of claim 2 wherein the cooling block is a cold plate having at least one cool fluid input and at least one warm fluid output.

4. The apparatus of claim 1 wherein the cooling mass is a vapor chamber.

5. The apparatus of claim 1 wherein the spring element includes a lever arm that creates a torque about the axis of rotation as the obstruction is being overcome.

6. The apparatus of claim 1 wherein the axis of rotation runs along a pin that runs parallel with a backplane that the electro-mechanical connector is mounted to.

7. The apparatus of claim 1 wherein the axis of rotation is at the opening.

8. An electronic system, comprising:
an electro-mechanical connector to receive a hot pluggable electronic component;
a cooling mass;
a cooling block including an opening to receive a portion of the cooling mass; and
a spring element to be rotated about an axis of rotation, an obstruction between the hot pluggable electronic component and the electro-mechanical connector to be removed by the spring element's rotation, the cooling mass to be pressed toward the hot pluggable electronic component in response to a force induced by the spring element's rotation.

9. The electronic system of claim 8 wherein the cooling mass is a heat spreader.

10. The electronic system of claim 8 wherein the cooling mass is a vapor chamber.

11. The electronic system of claim 8 wherein the spring element includes a lever arm that creates a torque about the axis of rotation as the obstruction is being overcome.

12. The electronic system of claim 8 wherein the axis of rotation runs along a pin that runs parallel with a backplane that the electro-mechanical connector is mounted to.

13. The electronic system of claim 8 wherein the axis of rotation is at the opening.

14. The electronic system of claim 8 wherein the electro-mechanical connector is a PCIe connector.

15. A data center, comprising:
a heat exchanger; and
a plurality of racks, the plurality of racks respectively including installed electronic systems, the respectively installed electronic systems communicatively coupled by one or more networks, wherein, one of the respectively installed electronic systems includes a), b), c), d), and e) below:
a) an electro-mechanical connector;
b) a hot pluggable electronic component that is plugged into the electro-mechanical connector;
c) a cooling mass;
d) a cooling block including an opening to receive a portion of the cooling mass, the cooling block having an input port that receives cooled fluid from the heat exchanger and an exit port that sends warmed fluid to the heat exchanger; and
e) a spring element rotated about an axis of rotation, an obstruction between the hot pluggable electronic component and the electro-mechanical connector removed by the spring element's rotation, the cooling mass pressed toward the hot pluggable electronic component in response to a force induced by the spring element's rotation.

16. The data center of claim 15 wherein the spring element includes a lever arm that creates a torque about the axis of rotation when the obstruction is being overcome.

17. The data center of claim 16 wherein the axis of rotation runs along a pin that runs parallel with a backplane that the electro-mechanical connector is mounted to.

18. The data center of claim 16 wherein the axis of rotation is at the opening.

19. The data center of claim 15 wherein the electro-mechanical connector is a PCIe connector and the hot pluggable electronic component is a solid state drive (SSD).

* * * * *